United States Patent [19]
Parle et al.

[11] Patent Number: 5,206,650
[45] Date of Patent: Apr. 27, 1993

[54] CHARGE-CONTROLLED INTEGRATING SUCCESSIVE-APPROXIMATION ANALOG-TO-DIGITAL CONVERTER

[75] Inventors: Jonathan J. Parle, Seattle; Todd E. Holmdahl, Bothell; A. Brinkley Barr, Woodinville, all of Wash.

[73] Assignee: John Fluke Mfg. Co., Inc., Everett, Wash.

[21] Appl. No.: 755,085

[22] Filed: Sep. 5, 1991

[51] Int. Cl.$^5$ ............................................. H03M 1/38
[52] U.S. Cl. ................................. 341/163; 341/155
[58] Field of Search ............... 341/163, 127, 128, 129, 341/155, 164, 166, 167, 168, 169, 170, 159, 172

[56] References Cited

U.S. PATENT DOCUMENTS

| | | | |
|---|---|---|---|
| 3,631,467 | 12/1971 | Vojvodich et al. | 341/166 |
| 4,195,282 | 3/1980 | Cameron | 341/172 |
| 4,939,520 | 7/1990 | Biglow | 341/167 |
| 5,012,247 | 4/1991 | Dillman | 341/172 |

OTHER PUBLICATIONS

Hermann Schmid, "An Electronic Design practical guide to A/D conversion," Electronic Design, vol. 16, No. 25, Dec. 5, 1968, pp. 50-72.

Primary Examiner—Jeffrey A. Gaffin
Assistant Examiner—Brian K. Young
Attorney, Agent, or Firm—George T. Noe

[57] ABSTRACT

A charge-controlled integrating successive-approximation analog-to-digital converter first stores a charge proportional to an unknown voltage in a manner similar to a dual-slope integrating ADC, and thereafter a successive-approximation binary search sequence algorithm is applied to the integrator to determine digital bits representative of the unknown voltage. The result is a relatively simple and inexpensive ADC having high resolution and accuracy, and comparatively fast conversion rates, and exhibiting low power consumption, high noise rejection, and multiple-speed versatility. The preferred embodiment described is a 16-bit ADC with less than 20 millisecond conversion time.

10 Claims, 4 Drawing Sheets

| CHARGE PACKET NUMBER | TIME IN COUNTS | RESISTOR | CHARGE |
|---|---|---|---|
| 1 | 64 | R3=R1/16 | $Q_{FS}/2$ |
| 2 | 32 | R3 | $Q_{FS}/4$ |
| 3 | 16 | R3 | $Q_{FS}/8$ |
| 4 | 8 | R3 | $Q_{FS}/16$ |
| 5 | 4 | R3 | $Q_{FS}/32$ |
| 6 | 2 | R3 | $Q_{FS}/64$ |
| 7 | 1 | R3 | $Q_{FS}/128$ |
| 8 | 8 | R1 | $Q_{FS}/256$ |
| 9 | 4 | R1 | $Q_{FS}/512$ |
| 10 | 2 | R1 | $Q_{FS}/1024$ |
| 11 | 1 | R1 | $Q_{FS}/2048$ |
| 12 | 8 | R2=16R1 | $Q_{FS}/4096$ |
| 13 | 4 | R2 | $Q_{FS}/8192$ |
| 14 | 2 | R2 | $Q_{FS}/16384$ |
| 15 | 1 | R2 | $Q_{FS}/32768$ |

*FIG. 3*

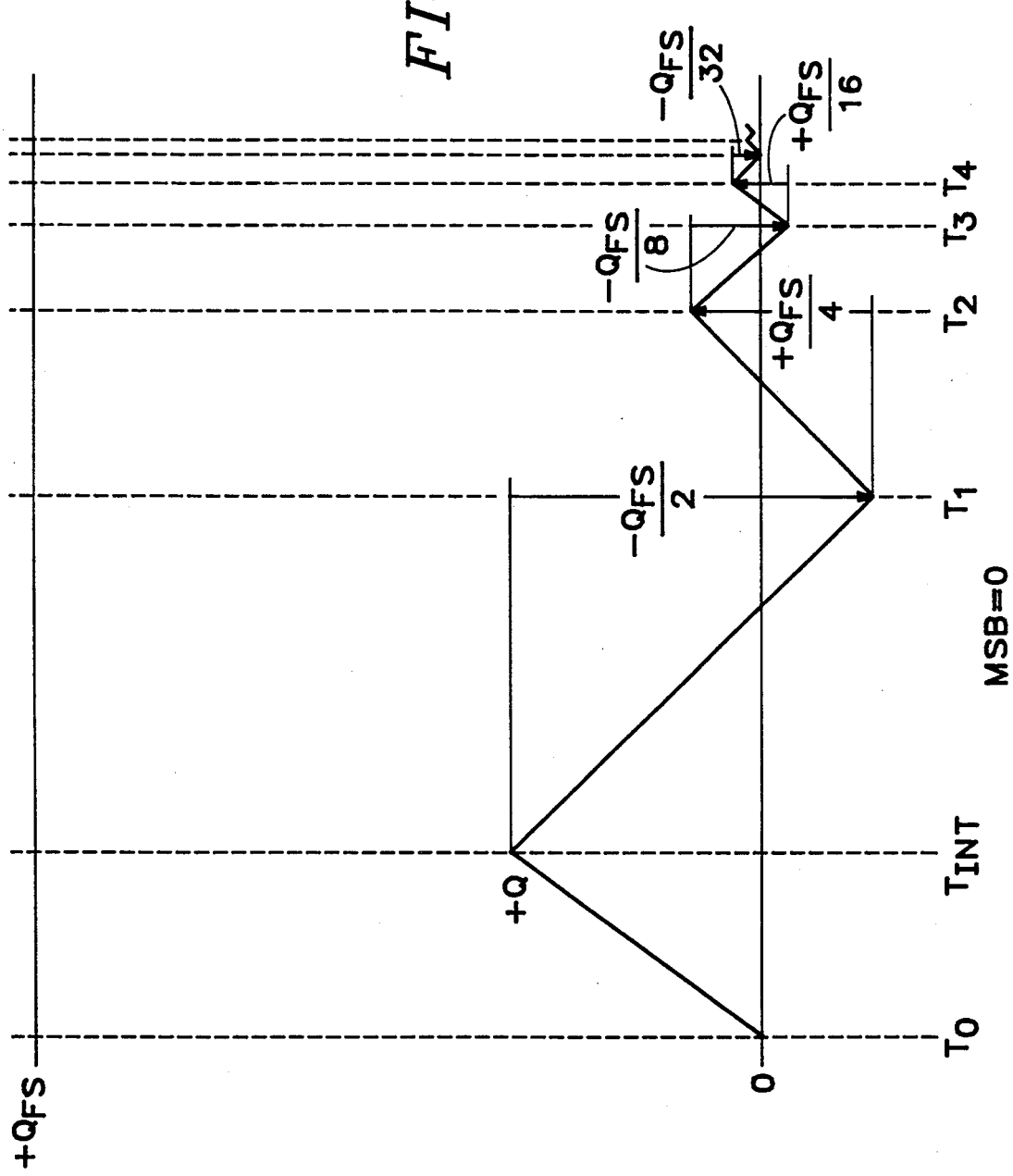

CHARGE-CONTROLLED INTEGRATING SUCCESSIVE-APPROXIMATION ANALOG-TO-DIGITAL CONVERTER

BACKGROUND OF THE INVENTION

This invention relates generally to analog-to-digital converters, and in particular to a charge-controlled integrating successive-approximation analog-to-digital converter (ADC).

Conventional successive-approximation ADCs employ a binary search approach to locate each digital bit of a multiple-bit digital word representing an analog voltage value that has been sampled and held to permit the conversion process to take place. The successive-approximation ADC typically includes a comparator to compare predetermined successive binary-weighted reference voltages with the input analog voltage. The successive reference voltages, which are generated by either a parallel-feedback digital-to-analog converter (DAC) or a network of binary-weighted resistive dividers connectable by a controller to D.C. voltage sources, follow the form $V_{REF} = V_{RANGE}(a_1 2^{-1} + a_2 2^{-2} + a_3 2^{-3} + \ldots a_n 2^{-n})$ wherein $V_{RANGE}$ is the range of the ADC window and each $a_n$ is a digital bit. This type of converter is capable of a moderately fast conversion rate. Some of the disadvantages associated with this type of converter include higher complexity and cost in order to achieve higher accuracy and resolution, and lack of noise rejection without subsequent filtering.

Conventional charge-balanced ADCs operate in a manner similar to successive-approximation ADCs in that capacitors or charge transfer devices are used to manipulate electrical charges in a $Q/2 \pm Q/4 \pm Q/8 \pm Q/16$, etc., search sequence, adding or subtracting binary-weighted charges to or from a stored charge proportional to an analog voltage, to locate the digital bits. This type of ADC requires the construction of 16 binary ratioed capacitors for a 16-bit ADC. Hence, for 16-bit accuracy, the ADC is a relatively expensive device. Moderate conversion speeds require a high clock frequency, which means these devices consume inordinate amounts of power. This technique has no inherent noise rejection.

Another type of charge-balanced ADC is the dual-slope converter. This converter represents the unknown input voltage as charge stored on a capacitor in an integrator circuit. The amount of charge stored on the integrator capacitor is obtained by measuring the amount of time required to remove the charge. Thus, the time measured is proportional to the unknown voltage. This conversion process has excellent noise immunity achieved by properly setting the time required for the integrator capacitor to acquire charge. The major disadvantage of this type of converter is a long conversion time.

It would be desirable to provide an ADC combining the favorable attributes of successive-approximation and dual-slope converters for high resolution and accuracy, and yet being relatively simple and inexpensive, and exhibiting low power consumption, high noise rejection, and multiple-speed versatility.

SUMMARY OF THE INVENTION

In accordance with the present invention, a charge-controlled integrating successive-approximation ADC meets the foregoing and other requirements.

The preferred embodiment includes an integrator, a comparator, and a controller connected in a manner similer to a conventional dual-slope converter; however, an algorithm similar to that used for successive approximation is utilized to determine the digital bits representative of an analog voltage. An unknown analog voltage is applied to the integrator for a predetermined period of time, and a charge proportional to the unknown voltage is accumulated on the integrator's storage capacitor. Thereafter, the successive-approximation algorithm is applied in a $Q/2 \pm Q/4 \pm Q/8$, etc., sequence wherein the charges added to or subtracted from the storage capacitor are selected by the successive-approximation controller in accordance with the combination of time and current required to produce a particular charge, since $Q = Idt$. Accordingly, a resistor network selectably connectable to positive and negative D.C. reference voltage sources provides the current required while the timing is established by timing circuitry within the controller. The resistive network in the preferred embodiment is realized using only three resistors having a 16:1 ratio relationship with each other to establish a 16-bit ADC. The predetermined time period for integrating the charge proportional to the unknown voltage may suitably be a multiple of line-frequency periods thereby to provide line-frequency noise rejection.

It is therefore one object of the invention to provide a combined charge-controlled successive-approximation analog-to-digital converter.

It is another object of the present invention to provide an analog-to-digital converter which exhibits high resolution and accuracy, yet is capable of conversion speeds higher than those for conventional dual-slope analog-to-digital converters.

It is a further object of the present invention to provide an improved analog-to-digital converter that is relatively simple and inexpensive, and exhibits low power consumption, high noise rejection, and multiple-speed versatility.

Other objects, features, and advantages of the present invention will become obvious to those having ordinary skill in the art upon a reading of the following description when taken in conjunction with the accompanying drawings.

BRIEF DESCRIPTION OF THE DRAWINGS

FIG. 3 is a table of parameters required to realize a number of charge packets for a successive-approximation algorithm; and FIG. 4 is a waveform of the integrator output showing the state of charge during ADC operation.

DETAILED DESCRIPTION OF THE INVENTION

Figure 1:
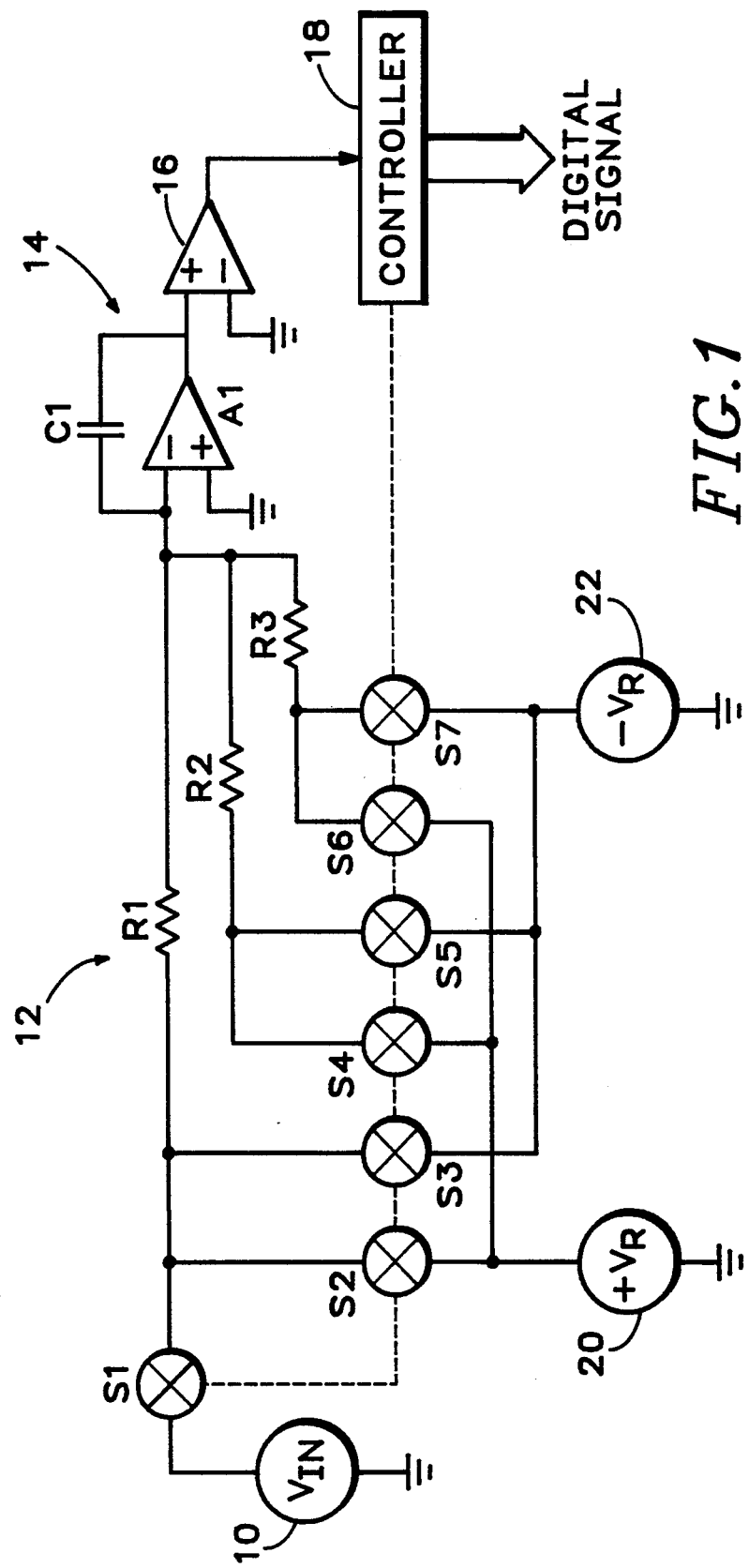
FIG. 1 is a schematic diagram of a charge-controlled integrating successive-approximation ADC in accordance with the preferred embodiment of the present invention.

Referring to FIG. 1 of the drawings, a charge-balanced successive-approximation ADC in accordance with the preferred embodiment of the present invention generally includes an input voltage source 10, a resistive network 12, an integrator 14, a comparator 16, and a controller 18. Input voltage source 10 may suitably be a stored sample of an unknown analog voltage, the value of which is to be converted to a digital representation. The resistive network 12 for the embodiment shown herein, which is a 16-bit ADC, comprises three resistors R1, R2, and R3, seven switches S1–S7, and positive and negative stable D.C. reference voltage supplies 20 and 22, respectively.

In this embodiment, for reasons which will become apparent later, resistors R1, R2, and R3 have resistance values that have a ratio relationship with each other such that R2=16R1 and R3=R1/16.

Figure 2:
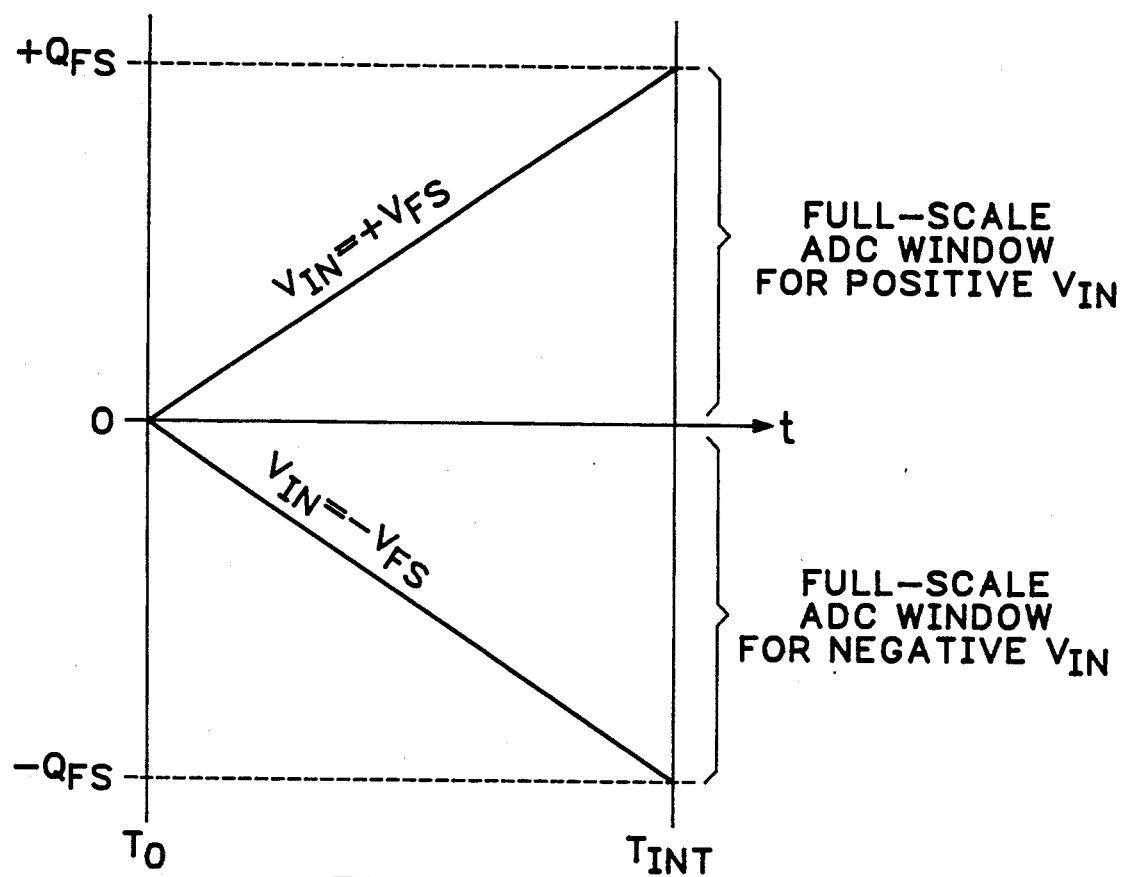
FIG. 2 illustrates the integration of the unknown input voltage.

Integrator 14 comprises an integrating operational amplifier A1 and its associated feedback capacitor C1 connected from its output to its inverting (−) input. The inverting input of operational amplifier A1 is also connected to the resistive network 12, while the non-inverting (+) input thereof is connected to a reference level such as ground. The values of resistor R1 and capacitor C1 are chosen such that for a full scale input voltage $V_{FS}$ applied via switch S1 to produce a charging current through resistor R1, that is, the full positive or negative amplitude of the ADC input "window," integration from zero volts for a predetermined period of time $T_{INT}$ will result in a charge $Q_{FS}$ on capacitor C1. See FIG. 2. Of course, an unknown input voltage $V_{IN}$ will actually produce a charge $+Q$ or $-Q$ that will fall somewhere between these limits.

The output of integrator 14 is connected to one input of comparator 16, the other input of which is connected to a reference voltage level, such as ground, or zero volts, in this case. During the de-integrate cycle during which the logic bits are determined, comparator 16 notifies the controller 18 each time the output of integrator 14 passes through zero volts (zero state of charge).

Controller 18 functions as a conventional successive-approximation ADC controller, and includes a counter and other timing circuitry, and control circuitry to open and close switches S1 through S7 at the appropriate times and keep track of the logic bits produced. Since $Q = I dt$, charge packets may be created by controlling either the time or current or a combination of both parameters. Binary ratioed time increments may be accurately achieved using a binary counter. The accuracy of the clock is not a factor. If several values of current are available to create charge packets, and if these currents are established by a selection of various resistors and stable voltage sources, then the resistors R1–R3 need to be ratio matched with a binary ratio, as is done here as described above for a 16-bit ADC. The absolute accuracy of the resistors is not a factor. If the period of integration of the unknown input voltage $V_{IN}$ is made to be one line cycle, for example, 1/60 hertz=16.67 milliseconds, then the ADC will have the same noise rejection characteristic as a conventional dual-slope ADC. Of course, in this case, the accuracy of the clock becomes important.

Operation of the ADC is as follows: Assume that the predetermined period of integration time $T_{INT}$ is equal to one line cycle so that line frequency noise will be rejected. Let us also assume that the integration time will also be equal to 2048 counts so that the clock frequency associated with controller 18 will be 2048/16.67 milliseconds=122.85 kilohertz (kHz). The ratio-matched resistors R1–R3 as described above in combination with binary ratioed time increments generated from controller 18 will allow the generation of binary weighted charge packets. The table shown in FIG. 3 is an example of how fifteen charge packets may be realized for the successive-approximation algorithm, the search sequence of which is shown as an integrator-output waveform in FIG. 4.

Referring to FIG. 4, an unknown voltage is integrated for the period of time $T_{INT}$, and a charge Q attained. While the waveforms shown are for a positive charge Q, they would simply be inverted for a negative charge Q. The successive-approximation algorithm begins wherein switch S7 is closed for 64 counts (during which time switches S1–S6 are open), connecting negative voltage source 22 to resistor R3 to remove a charge equal to $Q_{FS}/2$ from capacitor C1 during a de-integrate cycle ending at time $T_1$. If, at the end of time $T_1$, comparator 16 has not tripped, indicating the charge $(Q-Q_{FS}/2)$ is still positive, the most significant logic bit is determined to be a "one." On the other hand, if the comparator 16 has tripped, indicating that the integrator output passed through zero and that the charge is therefore negative, the most significant logic bit is determined to be a "zero." Whether a "one" or a "zero" has been attained for the bit located determines whether charge is to be added or subtracted on the next cycle. For example, if a "one" is detected, the ADC will continue to subtract charge during the $Q_{FS}/4$ cycle ending at time $T_2$, so switch S7 will remain closed for 32 counts during integration of the second charge packet. However, if a "zero" was detected, switch S7 is opened and switch S6 is closed, connecting the positive reference supply 20 to R3 for 32 counts while the second charge packet is integrated, adding charge to the capacitor C1 during the $Q_{FS}/4$ cycle ending at time $T_2$. The algorithm repeats until all of the logic bits have been determined.

In this example, the resolution of the conversion will be one part in 32,768. Including sign, a 16-bit ADC has been realized, and the output is in 1's complement form. The time for conversion is the time required for the 15 charge packets to be either added to or subtracted from Q as directed by the successive-approximation algorithm plus the time required for integration of $V_{IN}$. In this example, there are 2048 counts for integration, and 157 counts for the successive-approximation algorithm to complete. Thus, a complete reading is available in under 20 milliseconds, corresponding to a reading rate of approximately 50 readings per second.

Consider the case where only a single resistor, e.g. R1, is available. In this case, the smallest charge packet available is $Q_{FS}/2048$. For this reason, the conversion will be limited to 11 bits. By using a resistor that is larger than the integrate resistor by some binary multiple, the resolution of the counter may be effectively increased by that multiple without increasing the clock frequency. In the example above, 15-bit resolution has been achieved by using a resistor value of 16R1.

Higher speed, lower resolution measurements may easily be made. For example, if the input is integrated for 8 counts using R1/16 and then resolved using a successive-approximation algorithm and charge packets 5 through 11, then a 7-bit conversion results. The time for conversion is 30 counts, or 245 microseconds. The ADC would have a conversion rate of 4000 readings per second and a resolution of 8 bits, including polarity.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. An analog-to-digital converter, comprising:
   input means for receiving an analog voltage;
   an integrator having an input coupled to said input means and an output, said integrator having a full-scale charge value dynamic operating range;
   control means for controlling a state of charge of said integrator by causing said integrator to first store an acummulated charge proportional to said analog voltage, said accumulated charge being within said full-scale charge value dynamic operating range, and thereafter remove and add charge in a binary search sequence to determine digital bits representative of said analog voltage, said binary search sequence first locating the most significant bit by comparing said accumulated charge with one-half the full-scale charge value, and continuing through the search sequence to locate each successively less significant bit by comparing said accumulated charge with successively halved full-scale charge values; and
   means coupled between the output of said integrator and said control means to monitor said state of charge and provide to said control means an indication of the logic states of said digital bits.

2. An analog-to-digital converter in accordance with claim 1 wherein said integrator comprises an operational amplifier having a capacitive element disposed between said input and said output, and said means coupled between the output of said integrator and said control means comprises a comparator having a first input coupled to said output of said integrator and a second input coupled to a reference level.

3. An analog-to-digital converter in accordance with claim 1 wherein said control means comprises means for generating predetermined currents for predetermined periods of time and causing said integrator to selectably integrate said currents.

4. An analog-to-digital converter in accordance with claim 3 wherein said control means includes timing means for establishing said predetermined periods of time, and said means for generating predetermined currents comprises at least one resistive element connectable between said input of said integrator and at least one predetermined reference voltage source.

5. An analog-to-digital converter in accordance with claim 4 wherein said means for generating predetermined currents comprises a plurality of resistors selectively connectable between said input of said integrator and predetermined positive and negative reference D.C. voltage sources.

6. An analog-to-digital converter in accordance with claim 5 wherein said plurality of resistors have binary-ratioed values.

7. An analog-to-digital converter in accordance with claim 5 wherein said plurality of resistors is a maximum of three having a binary-weighted relationship to each other.

8. An analog-to-digital converter, comprising:
   an input voltage source providing an input voltage to be converted to a digital representation thereof;
   an input network including at least one reference voltage source and a plurality of input resistors selectively connected to one of said input voltage source and said at least one reference voltage source;
   an integrator having a full-scale charge value defining an operating range coupled to said input network, said integrator having a storage capacitor which when one of said plurality of input resistors is selectively connected to said input voltage source stores an accumulated charge proportional to said input voltage;
   a comparator coupled to the output of said integrator for comparing the integrator output with a reference level and generating comparison signals in response thereto; and
   control means including timing means coupled to the output of said comparator for controlling selection of said plurality of input resistors to provide said predetermined currents for predetermined periods of time to remove and add charge to said storage capacitor in a binary search sequence wherein the full-scale charge value is successively halved for each binary search, and producing in response to said comparison signals at the end of each binary search successively less significant digital bits representative of said input voltage.

9. An analog-to-digital converter in accordance with claim 8 wherein said plurality of input resistors have a binary-weighted relationship to each other.

10. An analog-to-digital converter in accordance with claim 8 wherein said timing means produces predetermined binary-related periods of time.

* * * * *